United States Patent
Li et al.

(10) Patent No.: US 8,803,719 B2
(45) Date of Patent: Aug. 12, 2014

(54) SAMPLE AND HOLD CIRCUIT WITH TOGGLE CONTROL AND METHOD THEREOF

(75) Inventors: Yike Li, Chengdu (CN); Xiaoyu Xi, Chengdu (CN); Fei Wang, Shenzhen (CN); Zhengxing Li, Nanjing (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 13/538,940

(22) Filed: Jun. 29, 2012

(65) Prior Publication Data

US 2013/0002461 A1 Jan. 3, 2013

(30) Foreign Application Priority Data

Jun. 30, 2011 (CN) .......................... 2011 1 0181709

(51) Int. Cl.
*H03M 1/66* (2006.01)

(52) U.S. Cl.
USPC ........................................... 341/144; 341/122

(58) Field of Classification Search
USPC .................. 341/144, 155, 163, 164, 165, 122
See application file for complete search history.

(56) References Cited

U.S. PATENT DOCUMENTS

| 5,543,795 | A | * | 8/1996 | Fernald | 341/163 |
| 5,555,452 | A | * | 9/1996 | Callaway et al. | 455/226.2 |
| 7,026,966 | B2 | * | 4/2006 | Theiler | 341/120 |
| 8,085,179 | B2 | * | 12/2011 | Hainz | 341/155 |

* cited by examiner

*Primary Examiner* — Peguy Jean Pierre
(74) *Attorney, Agent, or Firm* — Perkins Coie LLP

(57) ABSTRACT

A sample and hold circuit and the method thereof are disclosed. The sample and hold circuit may be applied in voltage regulators or other circuits. The sample and hold circuit comprises: an input terminal configured to receive an input signal; an output terminal configured to provide an output signal; a control circuit configured to receive the input signal and the output signal, and wherein based on the input signal and the output signal, the control circuit generates a digital signal, and wherein the digital signal increases when the output signal is lower than the input signal, and maintains when the output signal is larger than or equal to the input signal; a digital-to-analog converter (DAC) configured to convert the digital signal to the output signal.

15 Claims, 7 Drawing Sheets

SAMPLE AND HOLD CIRCUIT WITH TOGGLE CONTROL AND METHOD THEREOF

CROSS-REFERENCE TO RELATED APPLICATION(S)

This application claims priority to and the benefit of Chinese Patent Application No. 201110181709.2, filed Jun. 30th, 2011, which is incorporated herein by reference in its entirety.

STATEMENT REGARDING FEDERALLY SPONSORED RESEARCH

APPENDICES

TECHNICAL FIELD

The present disclosure relates generally to electronic circuits, and more particularly but not exclusively to sample and hold circuits and the method thereof.

BACKGROUND

In a circuitry, the values, especially the peak values and amplitudes, of some signals are usually needed for system control or other purposes. FIG. 1 schematically shows a prior art peak value sample and hold circuit 100. The peak value sample and hold circuit 100 samples the value of an input signal $V_{IN}$, and generates an output signal $V_{OUT}$ indicating the peak value of the input signal $V_{IN}$. The peak value sample and hold circuit 100 comprises: a power supply Vcc and a ground signal $V_{GND}$; a PMOS (P-type Metal Oxide Semiconductor Field Effect Transistor) P1 with a source terminal coupled to the power supply Vcc and a drain terminal coupled to the output signal $V_{OUT}$; a capacitor C1 coupled between the output signal $V_{OUT}$ and the ground signal $V_{GND}$; a comparator 101 with a non-inverting input terminal coupled to the input signal $V_{IN}$ and an inverting terminal coupled to the output signal $V_{OUT}$.

The operation of the peak value sample and hold circuit 100 in FIG. 1 is: (1) when the input signal $V_{IN}$ is larger than the output signal $V_{OUT}$, the comparator 101 generates a logical low signal to turn ON the PMOS P1. As a result, the capacitor C1 is charged by the power supply Vcc, and the output signal $V_{OUT}$ increases until it reaches the input signal $V_{IN}$. Thus the output signal $V_{OUT}$ increases as the input signal $V_{IN}$ increases. (2) when the input signal $V_{IN}$ decreases or remains unchanged, the output signal $V_{OUT}$ maintains because the capacitor couldn't be discharged. So the output signal $V_{OUT}$ stores the peak value of the input signal $V_{IN}$. But in real application, the leakage current of the PMOS P1 may cause variation of the output signal $V_{OUT}$. For example, a parasitic diode D1 coupled between the source and the drain of the PMOS P1 may charge the capacitor C1 because of its non-ideal cutoff characteristic, which results in an error of the output signal $V_{OUT}$. For example, if the capacitance of the capacitor C1 is 100 pF, the leakage current of the PMOS P1 is 1 nA. After 20 ms, the increase of the output signal $V_{OUT}$ may be 0.2V. It is an unacceptable error in the most of the applications.

The present disclosure pertains to provide a precise and reliable sample and hold circuit.

SUMMARY

It is an object of the present disclosure to provide a precise and reliable sample and hold circuit and the method thereof.

In accomplishing the above and other objects, there has been provided, in accordance with an embodiment of the present disclosure, a sample and hold circuit comprising: an input terminal configured to receive an input signal; an output terminal configured to provide an output signal; a control circuit configured to receive the input signal and the output signal, wherein based on the input signal and the output signal, the control circuit generates a digital signal, and wherein the digital signal increases when the output signal is lower than the input signal, and maintains the previous value when the output signal is larger than or equal to the input signal; a digital-to-analog converter (DAC) configured to convert the digital signal to the output signal.

Furthermore, there has been provided, in accordance with an embodiment of the present disclosure, a sample and hold method for an input signal comprising: receiving a input signal; providing an output signal; generating a digital signal based on the input signal and the output signal, and wherein the digital signal increases when the output signal is lower than the input signal, and maintains the previous value when the output signal is larger than or equal to the input signal; converting the digital signal to the output signal.

The sample and hold circuits and the method in accordance with the embodiments of the present disclosure could sample the input signal timely and precisely, especially the peak value of the input signal.

The use of the same reference label in different drawings indicates same or like components.

DETAILED DESCRIPTION

In the present disclosure, numerous specific details are provided, such as examples of circuits, components, and methods, to provide a thorough understanding of embodiments of the disclosure. Persons of ordinary skill in the art will recognize, however, that the disclosure can be practiced without one or more of the specific details. In other instances, well-known details are not shown or described to avoid obscuring aspects of the disclosure.

Figure 1:
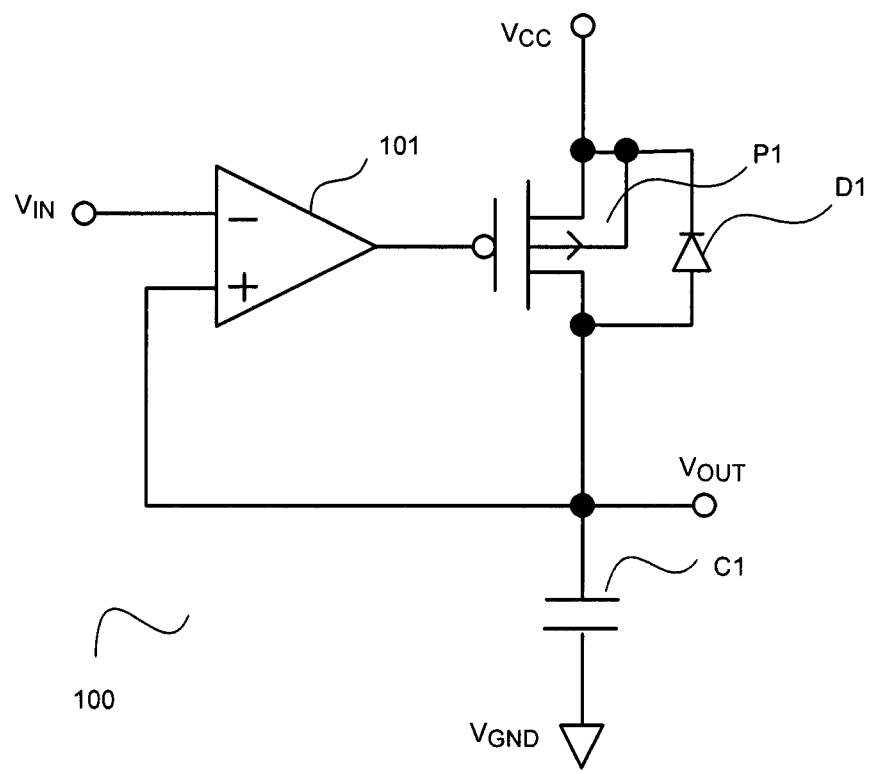
FIG. 1 schematically shows a prior art peak value sample and hold circuit 100.
Figure 2A:
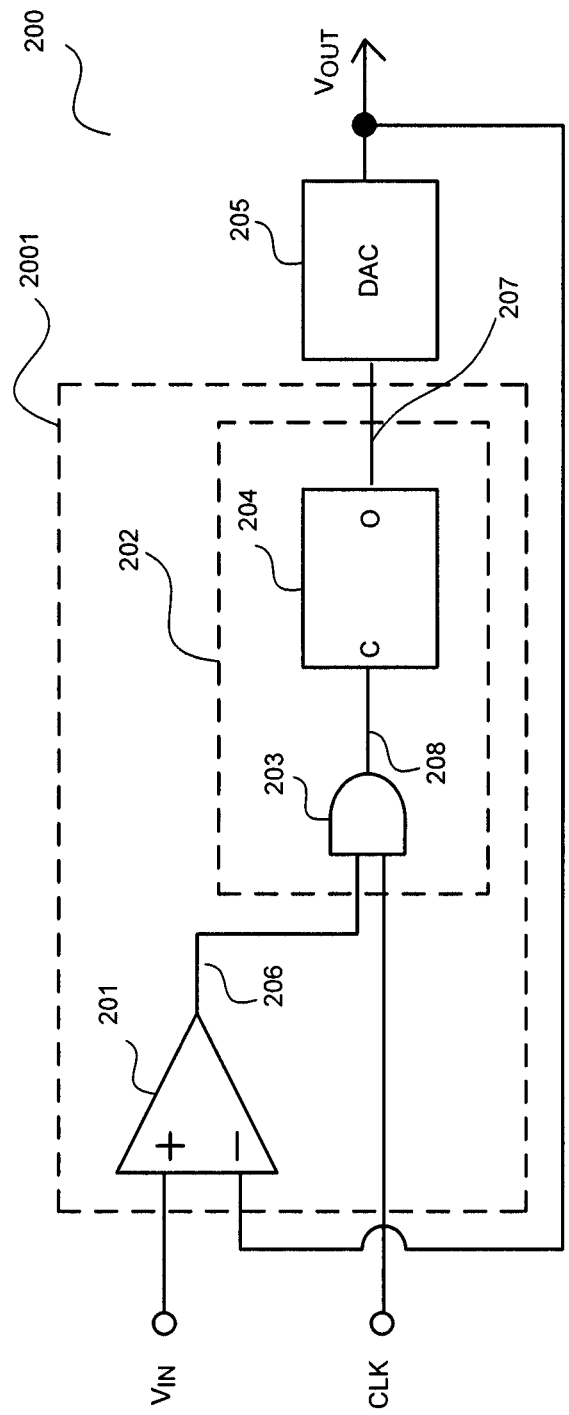
FIG. 2A shows a block diagram of a sample and hold circuit 200 in accordance with an embodiment of the present disclosure.

FIG. 2A shows a block diagram of a sample and hold circuit 200 in accordance with an embodiment of the present disclosure. The sample and hold circuit 200 comprises: an input terminal configured to receive an input signal $V_{IN}$; an output terminal configured to provide an output signal $V_{OUT}$; a control circuit 2001 configured to receive the input signal $V_{IN}$ and the output signal $V_{OUT}$, wherein based on the input signal $V_{IN}$ and the output signal $V_{OUT}$, the control circuit 2001 generates a digital signal 207; a DAC (digital-to-analog converter) 205 configured to convert the digital signal 207 to the output signal $V_{OUT}$.

In one embodiment, the control circuit 2001 comprises: a first comparator 201 having a first input terminal, a second input terminal and an output terminal, wherein the first input terminal is configured to receive the input signal $V_{IN}$, the second input terminal is configured to receive the output signal $V_{OUT}$, and wherein based on the input signal $V_{IN}$ and the output signal $V_{OUT}$, the first comparator 201 generates a toggle control signal 206 at the output terminal; a logic circuit 202 coupled to the first comparator 201 to receive the toggle control signal 206, wherein based on the toggle control signal 206, the logic circuit 202 generates the digital signal 207. In one embodiment, the sample and hold circuit 200 further comprises a clock terminal configured to receive a clock signal CLK. In some embodiments, the clock signal CLK is generated by the control circuit 2001. In some embodiments, the clock signal CLK is generated by the logic circuit 202 and the clock terminal could be eliminated.

In the example of FIG. 2A, the logic circuit 202 comprises an AND gate 203 and an arithmetic unit 204. The AND gate 203 has two input terminals which is respectively configured to receive the toggle control signal 206 and the clock signal CLK, and based on the toggle control signal 206 and the clock signal CLK, the AND gate 203 generates a second clock signal 208. When the toggle control signal 206 is logical high, the second clock signal 208 follows the clock signal CLK. When the toggle control signal 206 is logical low, the clock signal CLK is blocked and the second clock signal 208 is logical low. In other embodiments, the clock signal CLK may be blocked with other circuits or methods, for example, the clock signal CLK may be blocked by enabling or disabling an oscillator which generates the clock signal CLK. Any suitable conventional blocking circuits for eliminating the effects of the clock signal CLK may be used without detracting from the merits of the present invention.

The units and circuits in the example of FIG. 2A are coupled together means that the units and circuits may be coupled directly, or may be coupled via inverters, wires, logic gates, transmission gates and flip-flops. Furthermore, the units and circuits may be coupled via functional units, logic units and arithmetic unit. Unless otherwise mentioned, the circuits and units directly coupled or indirectly coupled are both represented by solid lines.

In the example of FIG. 2A, the input signal $V_{IN}$ is provided to the non-inverting terminal of the first comparator 201 and the output signal $V_{OUT}$ is provided to the inverting terminal of the second comparator 201. When the output signal $V_{OUT}$ is lower than the input signal $V_{IN}$, the toggle control signal 206 is logical high, then the second clock signal 208 follows the clock signal CLK.

In some embodiments, the input signal $V_{IN}$ is provided to the inverting terminal of the first comparator 201 and the output signal $V_{OUT}$ provided to the non-inverting terminal of the second comparator 201. In that case, the AND gate 203 may be replaced by an OR gate. When the output signal $V_{OUT}$ is lower than the input signal $V_{IN}$, the toggle control signal is logical low. Then the second clock signal 208 follows the clock signal CLK. Persons of ordinary skill in the art should know that the AND gate 203 may be equivalent substituted without detracting from the merits of the present disclosure.

In the example of FIG. 2A, the AND gate 203, and the logic circuit 202 are controlled by the levels of the toggle control signal 206. In some embodiments, the logic circuit 202 may be controlled by the rising edge or falling edge of the toggle control signal 206.

Figure 2B:
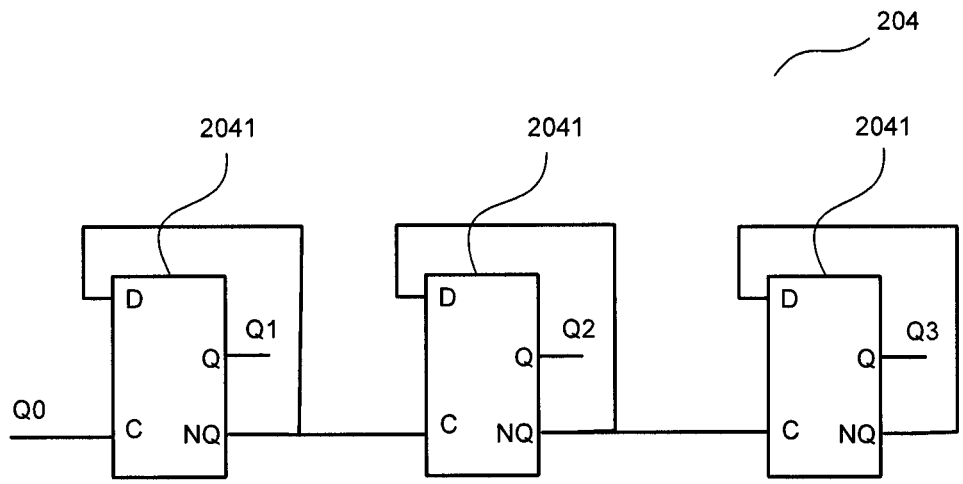
FIG. 2B schematically shows the arithmetic unit 204 in accordance with an embodiment of the present disclosure.
Figure 2C:
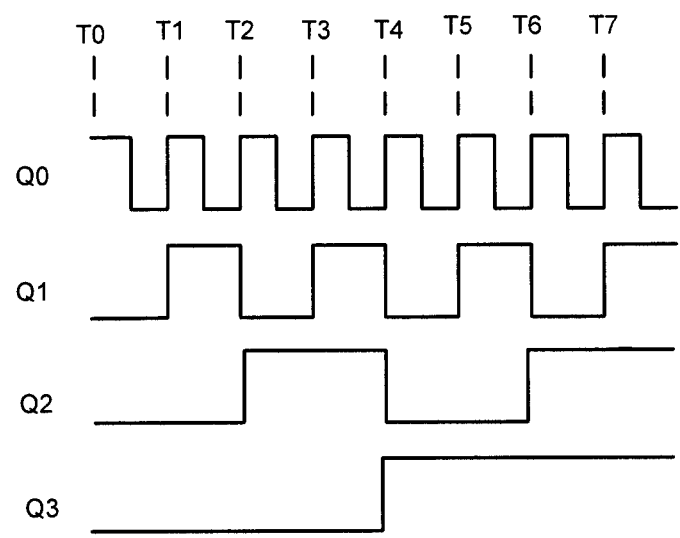
FIG. 2C shows the waveforms of the signals in the arithmetic unit 204 in FIG. 2B.

The second clock signal 208 controls the clocking operation of the arithmetic unit 204. FIG. 2B schematically shows the arithmetic unit 204 in accordance with an embodiment of the present disclosure, and FIG. 2C shows the waveforms of the signals in the arithmetic unit 204. The arithmetic unit 204 comprises three D-flip-flops 2041, 2042 and 2043 coupled as shown. Each D-flip-flop has an input terminal "D", a clock terminal "C", a non-inverting output terminal "Q" and an inverting output terminal "NQ". Each D-flip-flop transmits the signal at the input terminal "D" to the non-inverting output terminal "Q" at the rising edge of the signal at the clock terminal "C". Signals Q1, Q2 and Q3 are the respective output signals at each non-inverting output terminal "Q" of the D-flip-flop 2041, 2042 and 2043. Signal Q0 corresponds to the second clock signal 208. In one embodiment, the signals Q1, Q2 and Q3 constitutes the bit-stream of the digital signal 207 (generated at the output terminal of the arithmetic unit 204), wherein Q3 is the first bit, which is also referred as left bit, and Q1 is the last bit, which is also referred as right bit. For example, the value of the digital signal 207 is 000 in binary when Q1=0, Q2=0 and Q3=0, and the value of the digital signal 207 is 100 in binary when Q1=0, Q2=0 and Q3=1. In the example of FIG. 2B, the digital signal 207 has three digits. Persons of ordinary skill in the art should know that the digital signal 207 may have four, five or more digits in some embodiments. Also, in some embodiments, the bit of the digital signal 207 may be represented by more than two levels.

In FIG. 2C, the signals Q3, Q2 and Q1 are all logical low at time T0, which means the digital signal 207 is 000 in binary. At this time, the signal at the inverting output terminal "NQ" of the D-flip-flop 2041 is logical high, so is the signal at the input terminal "D" of the D-flip-flop 2041. At the rising edge of the signal Q0 (time T1), the high logical signal at the input terminal "D" of the D-flip-flop 2041 is transmitted to the non-inverting output terminal "Q" of the D-flip-flop 2041, which means the signal Q1 becomes logical high and the signal at the inverting output terminal "NQ" of the D-flip-flop 2041 becomes logical low. The signals Q2 and Q3 maintain logical low. Thus, the value of the digital signal 207 is 001 in binary. The operation described hereinbefore is defined as a toggle operation wherein the rising edge of the signal Q0 pulse toggles the arithmetic unit 204. At time T2, the rising edge of the next signal Q0 pulse toggles the arithmetic unit 204 and the value of digital signal 207 becomes 010 in binary. Finally, at time T7, the digital signal 207 reaches the highest value of 111 in binary.

In other embodiments, the D-flip-flops 2041, 2042 and 2043 may each have a reset terminal "R". In one embodiment, when a reset signal provided to the reset terminal "R" is logical high, the D-flip-flop is reset, and the signal at the non-inverting output terminal is logical low. When the reset signal is logical low, the D-flip-flop operates as described before.

In some embodiments, the arithmetic unit 204 may comprise T-flip-flop or other arithmetic circuits. Any suitable circuits for realizing the logical function described above may be used without detracting from the merits of the present disclosure. The logic circuit 202 and the arithmetic unit 204 may be automatically generated by hardware description language, for example, VHDL (Very-High-Speed Integrated Circuit Hardware Description Language) or Verilog HDL, by person of ordinary skill in the art.

In conclusion, the arithmetic unit 204 is toggled and the resultant digital signal 207 is outputted when the second clock signal 208 is pulsed.

The digital-to-analog converter 205 converts the digital signal 207 to an analog output signal $V_{OUT}$. The digital-to-analog converters are familiar to persons of ordinary skill in the art and are not described for brevity. If high accuracy is demanded, the digital-to-analog converter with more bits may be chose. Thus, the cost will increase.

The control circuit 2001, the logic circuit 202, the digital-to-analog converter 205 are not limited to the circuits shown in FIG. 2A. Any suitable circuits fulfill the same function could be used without detracting from the merits of the present disclosure. Persons of ordinary skill in the art should know that the control circuit 2001 may comprise the digital-to-analog converter 205, which means that the digital-to-analog converter 205 is no long an independent part but is integrated to the control circuit 2001. The equivalent substitution, the integration, the re-division of the circuits in FIG. 2A could be performed without detracting from the merits of the present disclosure.

The output signal $V_{OUT}$ increases as the digital signal 207 is increased via toggling the arithmetic unit 204. When the output signal $V_{OUT}$ increases to the input signal $V_{IN}$, the toggle control signal 206 is logical low and blocks the clock signal CLK. Thus the second clock signal 208 is logical low, and the digital signal 207 maintains the previous value. Persons of ordinary skill in the art should know that the non-ideality of the comparator 201, for example, the non-ideality caused by an offset voltage, may make the digital signal 207 maintain when the output signal $V_{OUT}$ is larger than or lower than the input signal $V_{IN}$. The toggle operation of the control circuit 2001 will stop when the input signal $V_{IN}$ decreases to be lower than the output signal $V_{OUT}$ suddenly.

Persons of ordinary skill in the art could obtain a suitable circuit performing the above operation by programming the function with digital language.

If high accuracy is demanded, an eight-bits digital-to-analog converter may be applied. In that case, $2^8$ clock cycles are needed for increasing from 00000000 to 11111111. Then more optimized circuits are needed to speed up the operation.

Figure 3:
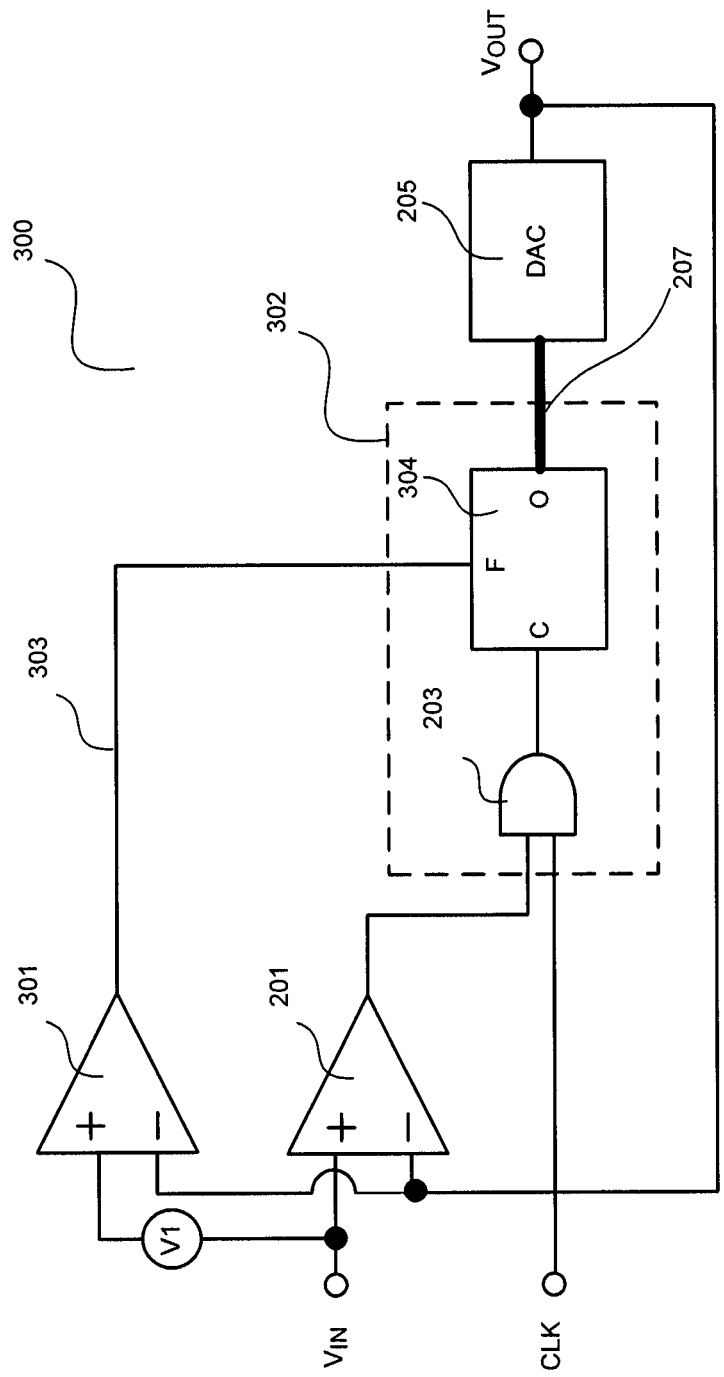
FIG. 3 shows a block diagram of a sample and hold circuit 300 in accordance with an embodiment of the present disclosure.

FIG. 3 shows a block diagram of a sample and hold circuit 300 in accordance with an embodiment of the present disclosure. Compared to the sample and hold circuit 200 in FIG. 2A, the sample and hold circuit 300 further comprises a second comparator 301 having a first input terminal, a second input terminal and an output terminal, wherein the first input terminal is coupled to the input signal $V_{IN}$ via a voltage source V1, the second input terminal is configured to receive the output signal $V_{OUT}$. In one embodiment, the voltage source V1 indicates that there is a voltage difference Vos between the first input terminal of the comparator 301 and the input signal $V_{IN}$. The voltage difference Vos is also referred as a first voltage difference. In one embodiment, the first voltage difference may be realized by a resistor with a current flowing through it. The voltage at the first input terminal of the comparator 301 is referred as a first input signal, and the value of the first input signal is equal to the input signal $V_{IN}$ minus the first voltage difference Vos. When the output signal $V_{OUT}$ is lower than the first input signal, which means the output signal $V_{OUT}$ will increase to the expected value after many clock cycles, the toggle speeding signal 303 is logical high and indicates the logic circuit 302 to speed up the toggle operation of the digital signal 207.

When the toggle speeding signal 303 is valid, the digital signal 207 increases. In some embodiments, the digital signal 207 may have five bits, and increases from 00000 to 00100 in a clock cycle, or it increases from 00000 to 00010 in a clock cycle when the toggle speeding signal 303 is logical high. Any suitable toggle operation may be induced without detracting from the merits of the present disclosure.

When the output signal $V_{OUT}$ increases to the first input signal, the toggle speeding signal 303 is logical low. Then the sample and hold circuit 300 works similarly with the sample and hold circuit 200 in FIG. 2A. In one embodiment, the toggle speeding signal 303 is valid when it is logical low. In one embodiment, the digital signal 207 increases bit by bit, for example, from 00100 to 00101. When the toggle speeding signal 303 is valid, the toggle operation is speeded up.

The first voltage difference may be determined according to the relationship between the output signal $V_{OUT}$ and the digital signal 207, and also according to the speed of the toggle operation when the toggle speeding signal is valid. For example, if the output signal $V_{OUT}$ increases 0.1 Volts when the digital signal 207 increases one bit, and if the output signal $V_{OUT}$ increases 0.8 Volts when the toggle speeding signal is valid, the first voltage difference may be 2 Volts. It means that when the output signal $V_{OUT}$ is more than 2 Volts lower than the input signal $V_{IN}$, the toggle speeding signal 303 is valid, and then the digital signal 207 increases 8 bits and the output signal $V_{OUT}$ increases 0.8 Volts in a clock cycle. When the voltage difference between the output signal $V_{OUT}$ and the input signal $V_{IN}$ is less than 2 Volts, the toggle speeding signal 303 is invalid and the digital signal 207 increases 1 bit and the output signal $V_{OUT}$ increased 0.1 Volts in a clock cycle.

In one embodiment, the first voltage difference may be realized by setting input transistors of the first comparator 201 or the second comparator 301 unmatched. So that the first comparator 201 flips when the output signal $V_{OUT}$ is equal to the input signal $V_{IN}$ while the second comparator 301 flips when the output signal $V_{OUT}$ is equal to the input signal $V_{IN}$ minus the first voltage difference. Any methods which could make the threshold of the first comparator 201 and the threshold of the second comparator 301 be different could be used without detracting from the merits of the present disclosure.

In one embodiment, a voltage source may be added to the output signal $V_{OUT}$ to validate the toggle speeding signal 303 when the output signal $V_{OUT}$ plus a voltage difference is equal to the input signal $V_{IN}$. Persons of ordinary skill in the art should know that any suitable circuits or methods speeding up the toggle operation when the output signal $V_{OUT}$ plus a preset difference voltage is equal to the input signal $V_{IN}$ could be used without detracting from the merits of the present disclosure.

The operation of the sample and hold circuit 300 is similar to the operation of the sample and hold circuit 200 and is not described for brevity.

As described hereinbefore, the peak value of the input signal $V_{IN}$ is sampled and held by the output signal $V_{OUT}$. Even when the input signal $V_{IN}$ decreases, the output signal $V_{OUT}$ maintains. In some systems, the peak value of the input signal $V_{IN}$ during a particular period of time is needed. So the output signal $V_{OUT}$ should be refreshed in each period of time.

Figure 4:
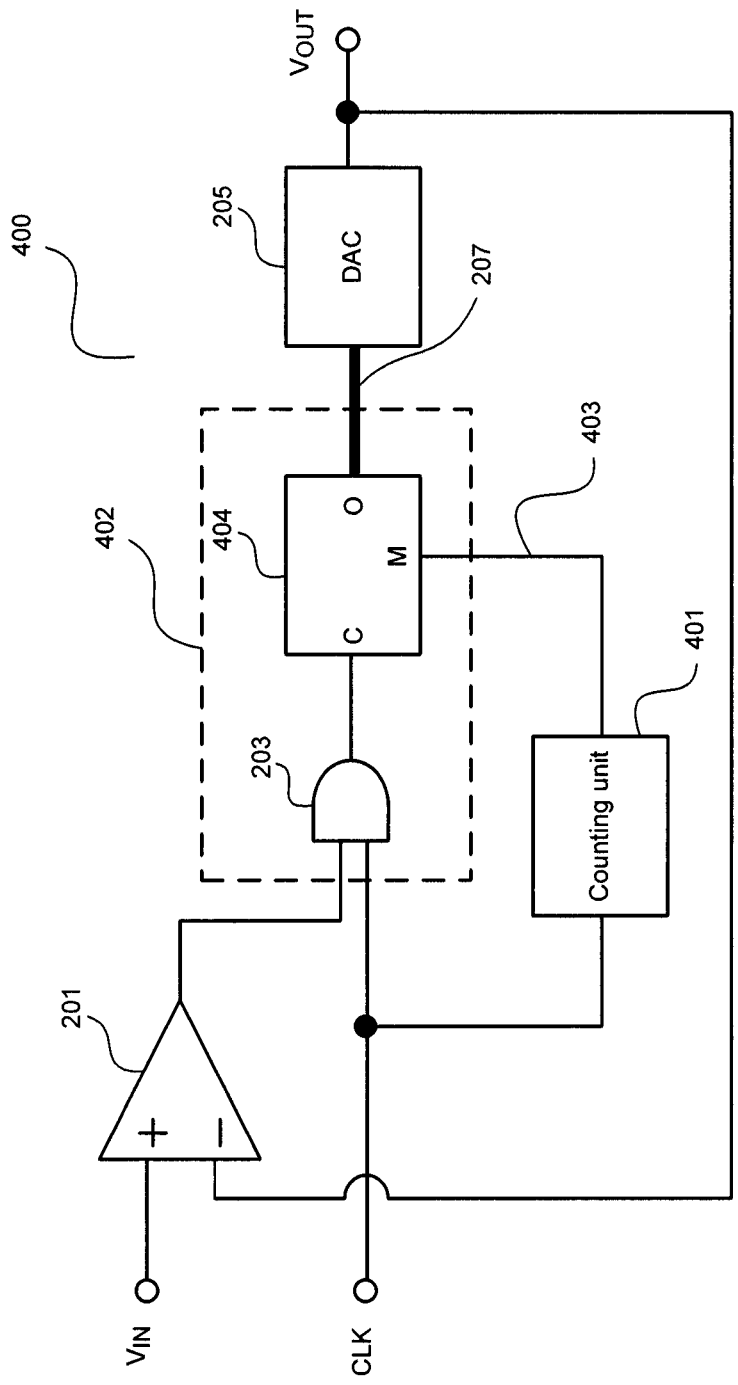
FIG. 4 shows a block diagram of a sample and hold circuit 400 in accordance with an embodiment of the present disclosure.

FIG. 4 shows a block diagram of a sample and hold circuit 400 in accordance with an embodiment of the present disclosure. The sample and hold circuit 400 makes improvement to the sample and hold circuit 200. The improvement could be applied in the sample and hold circuit 300 too.

Compared to the sample and hold circuit 200 in FIG. 2A, the circuit 400 further comprises: a counting unit 401 having an input terminal and an output terminal, wherein the input terminal is configured to receive the clock signal CLK, and wherein based on the clock signal CLK, the counting unit 401 generates a abdicate control signal 403 at the output terminal;

wherein the logic circuit 402 further receives the abdicate control signal 403, and wherein based on the abdicate control signal 403, the digital signal 207 decreases, for example, from 11111 to 11110, or from 11111 to 11101 and so on. The output signal $V_{OUT}$ decreases as the digital signal 207 is decreased via abdicating an arithmetic unit 404, correspondingly. If the decreased output signal $V_{OUT}$ is lower than the input signal $V_{IN}$, the digital signal 207 will increase as described hereinbefore and the output signal $V_{OUT}$ will increases. If the decreased output signal $V_{OUT}$ is still larger than the input signal $V_{IN}$, the digital signal 207 will decrease in the next time period.

In one embodiment, the counting unit 401 generates the abdicate control signal 403 without external signals. In one embodiment, the counting unit 401 generates the abdicate control signal 403 based on the clock signal CLK. For example, the abdicate control signal 403 is generated based on the frequency division of the clock signal CLK. In some applications, the frequency of the clock signal CLK may be high, for example, 1 MHz, in order to make the toggle operation fast. But the abdicate operation may be performed every few seconds or every few milliseconds.

Typically, the frequency of the abdicate control signal 403 could hardly be changed after it is set. In some applications, the frequency of the abdicate control signal is required to change according to the input signal.

Figure 5:
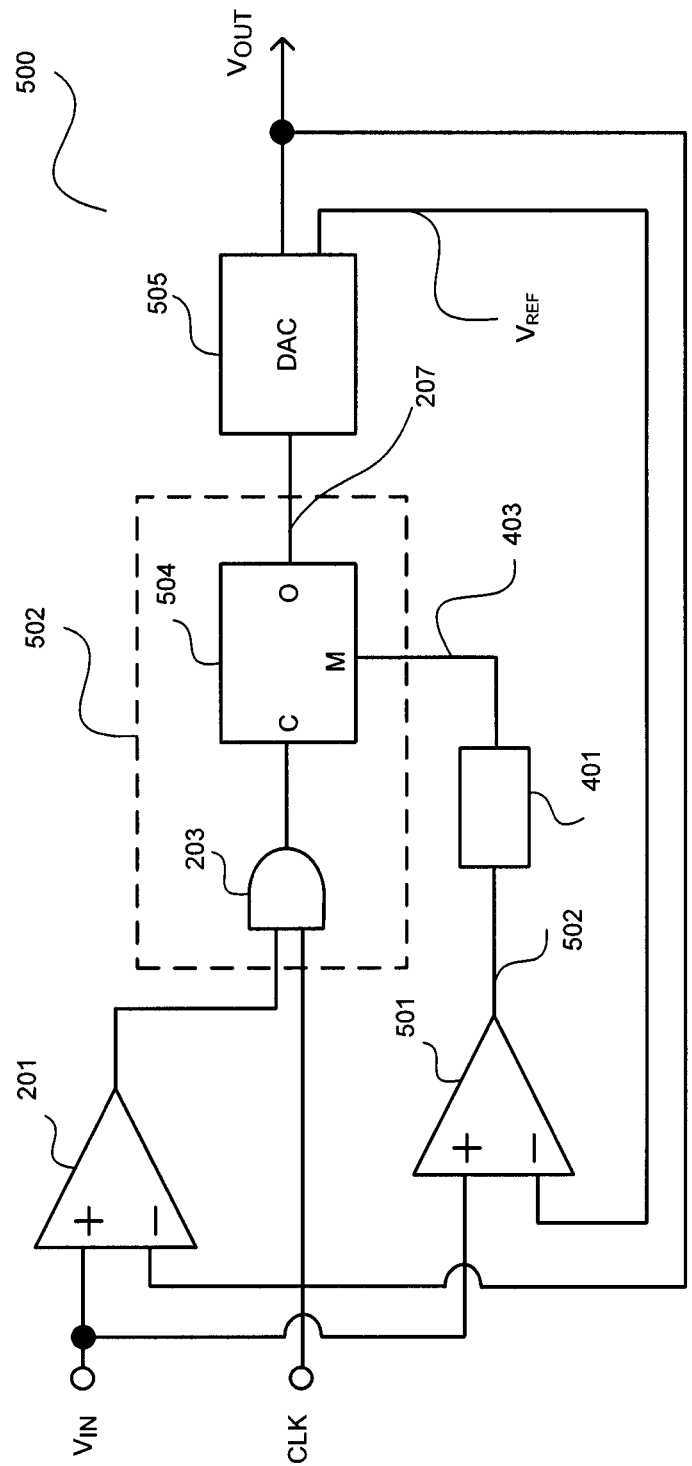
FIG. 5 shows a block diagram of a sample and hold circuit 500 in accordance with an embodiment of the present disclosure.

FIG. 5 shows a block diagram of a sample and hold circuit 500 in accordance with an embodiment of the present disclosure.

Compared to the sample and hold circuit 400 in FIG. 4, the sample and hold circuit 500 comprises: a digital-to-analog converter 505 configured to provide the output signal $V_{OUT}$ and a reference signal $V_{REF}$; a third comparator 501 configured to receive the input signal $V_{IN}$ and the reference signal $V_{REF}$, and wherein based on the input signal $V_{IN}$ and the reference signal $V_{REF}$, the third comparator 501 provides a square signal 502 to the counting unit 401. In one embodiment, the value of the reference signal $V_{REF}$ is half of the value of the output signal $V_{OUT}$.

The sample and hold circuit 500 is suitable for an input signal $V_{IN}$ which is waving. The input signal $V_{IN}$ may be periodic or random, and the magnitude of the input signal $V_{IN}$ may be constant or varying.

In one embodiment, the input signal $V_{IN}$ is a periodical signal, for example, a periodical sine wave signal, a periodical triangle wave signal or a periodical semiwave signal and so on. The magnitude of the input signal $V_{IN}$ may be constant or varying. The input signal $V_{IN}$ may change periodically during a time period, or may change periodically during the whole time period.

Figure 6:
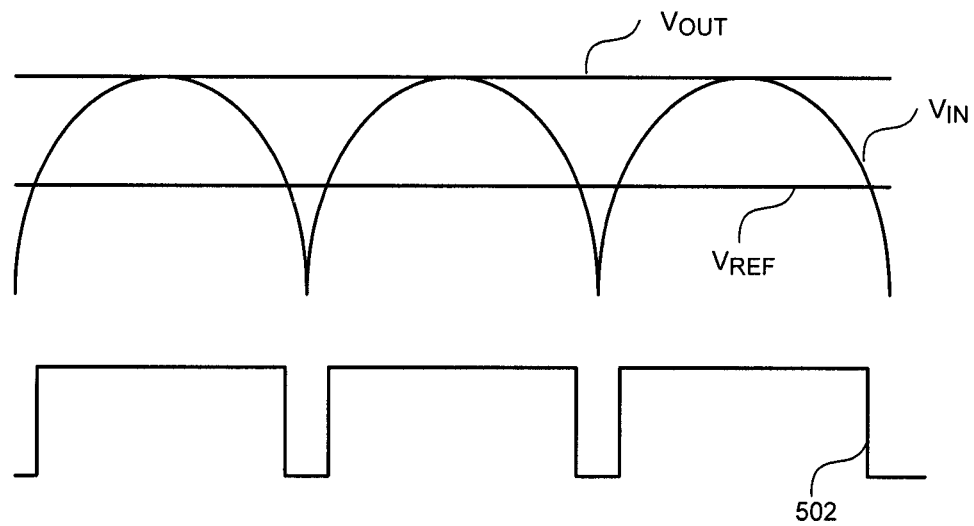
FIG. 6 shows an input signal $V_{IN}$ having a semiwave shape.

FIG. 6 shows an input signal $V_{IN}$ having a semiwave shape. The frequency of the input signal $V_{IN}$ is two times than the line frequency. As shown in FIG. 6, the third comparator 501 flips every time the output signal $V_{OUT}$ is equal to the input signal $V_{IN}$, so that it generates a square signal 502 provided to the counting unit 401.

The operation of the counting unit 401 may comprise frequency division. The frequency of the output signal of the counting unit 401 may be doubled, or tripled and so on. The output signal of the counting unit 401 is the abdicate control signal 403. That is to say, the abdicate control signal 403 is generated based on the square signal. A logic circuit 502 and an arithmetic unit 504 are configured to receive the abdicate control signal 403. The digital signal 207 generated by the logic circuit 502 decreases when the abdicate control signal 403 is valid.

The present disclosure discloses several embodiments of sample and hold circuits for sampling and holding peak values of signals. Persons of ordinary skill in the art should know that the embodiments could be applied to sample and hold valley values or secondary high values of signals and so on.

The digital circuits could be implemented in multiple ways. The present disclosure doesn't enumerate all of the detail circuits of logic circuits 202, 302, 402 and 502. Persons of ordinary skill in the art may perform the operation of toggle speed up and abdicate under the instruction of the books of digital design and software. Thus the detail circuits are not described for brevity.

Figure 7:
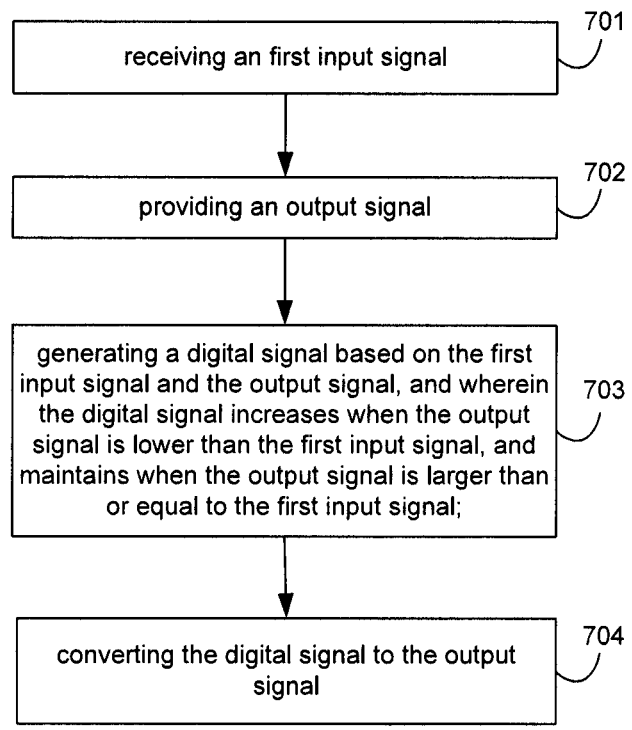
FIG. 7 shows a flowchart of a method 700 for sample and hold circuit in accordance with an embodiment of the present disclosure.

FIG. 7 shows a flowchart of a sample and hold method for an analog input signal in accordance with an embodiment of the present disclosure. The method comprises: step 701, receiving an analog input signal $V_{IN}$; step 702, providing an analog output signal $V_{OUT}$; step 703, generating a digital signal based on the analog input signal $V_{IN}$ and the analog output signal $V_{OUT}$, and wherein the digital signal increases when the analog output signal $V_{OUT}$ is lower than the analog input signal $V_{IN}$, and maintains when the analog output signal is larger than or equal to the analog input signal $V_{IN}$; and step 704, converting the digital signal to the analog output signal $V_{OUT}$.

In one embodiment, the sample and hold method further comprises: comparing the analog output signal $V_{OUT}$ with the analog input signal $V_{IN}$ to generate a toggle control signal; and generating the digital signal based on the toggle control signal, wherein the increase of the digital signal is determined by the toggle control signal. In one embodiment, the digital signal increases when the toggle control signal is logical high and maintains when the toggle control signal is logical low.

In one embodiment, the sample and hold method further comprises providing a clock signal, wherein the digital signal maintains when the clock signal is blocked or a clock signal generator is shut down by the toggle control signal. In one embodiment, the clock signal is generated by an external circuit or an internal circuit.

In one embodiment, the sample and hold method further comprises: speeding up the toggle operation when the analog input signal $V_{IN}$ minus a first voltage difference is larger than the analog output signal $V_{OUT}$.

In one embodiment, the sample and hold method further comprises: generating a abdicate control signal to control the abdicate operation of the digital signal, wherein the digital signal may be decreased bit by bit or be decreased several bits in one cycle. In one embodiment, the abdicate control signal is generated by a counting unit. In one embodiment, the abdicate control signal is generated based on the counting of the clock signal.

In one embodiment, the analog input signal $V_{IN}$ may be waving periodically or randomly. The analog input signal $V_{IN}$ may be waving during a time period, or may be waving during the whole time period.

In one embodiment, the sample and hold method further comprises: generating a reference signal; comparing the input signal with the reference signal to generate a square signal; and generating a abdicate control signal based on the square signal to control the abdicate operation of the digital signal; wherein the digital signal is decreased based on the abdicate control signal. In one embodiment, the value of the reference signal is half of the value of the output signal.

An effective technique for sample and hold circuit has been disclosed. While specific embodiments of the present disclosure have been provided, it is to be understood that these embodiments are for illustration purposes and not limiting.

Many additional embodiments will be apparent to persons of ordinary skill in the art reading this disclosure.

We claim:

1. A sample and hold circuit, comprising:
an input terminal configured to receive an input signal;
an output terminal configured to provide an output signal;
a control circuit configured to receive the input signal and the output signal, wherein based on the input signal and the output signal, the control circuit generates a digital signal, and wherein the digital signal is changed when the output signal is lower than the input signal, and wherein the digital signal is not changed when the output signal is larger than or equal to the input signal; and
a digital-to-analog converter (DAC) configured to convert the digital signal to the output signal;
wherein the control circuit comprises:
a first comparator having a first input terminal, a second input terminal and an output terminal, wherein the first input terminal is configured to receive the input signal, the second input terminal is configured to receive the output signal, and wherein based on the input signal and the output signal, the first comparator generates a toggle control signal at the output terminal; and
a logic circuit coupled to the first comparator to receive the toggle control signal, wherein based on the toggle control signal, the logic circuit generates the digital signal, and wherein the toggle operation of the digital signal is controlled by the toggle control signal.

2. The sample and hold circuit of claim 1, further comprises a clock terminal configured to receive a clock signal, and wherein the logic circuit receives the clock signal, and generates the digital signal based on the clock signal and the toggle control signal.

3. The sample and hold circuit of claim 2, wherein the control circuit further comprises:
a counting unit having an input terminal and an output terminal, wherein the input terminal is configured to receive the clock signal, and based on the clock signal, the counting unit generates a abdicate control signal at the output terminal; wherein
the logic circuit is further configured to receive the abdicate control signal, and wherein based on the clock signal, the toggle control signal and the abdicate control signal, the logic circuit generates the digital signal.

4. The sample and hold circuit of claim 1, wherein the control circuit further comprises:
a third comparator having a first input terminal, a second input terminal and an output terminal, wherein the first input terminal is configured to receive the input signal, the second input terminal is configured to receive a reference signal, and wherein based on the input signal and the reference signal, the third comparator generates a square signal; and
a counting unit having an input terminal and an output terminal, wherein the input terminal is configured to receive the square signal, and wherein based on the square signal, the counting unit generates a abdicate control signal at the output terminal;
wherein the logic circuit is further configured to receive the abdicate control signal, and wherein based on the clock signal, the toggle control signal and the abdicate control signal, the logic circuit generates the digital signal at the output terminal.

5. The sample and hold circuit of claim 4, wherein the reference signal is generated by the digital-to-analog converter.

6. The sample and hold circuit of claim 5, wherein the value of the reference signal is half of the value of the output signal.

7. The sample and hold circuit of claim 1, further comprising:
a second comparator having a first input terminal, a second input terminal and an output terminal, wherein the first input terminal is configured to receive a first input signal, the second input terminal is configured to receive the output signal, and wherein based on the first input signal and the output signal, the second comparator generates a toggle speeding signal at the output terminal; wherein
the control circuit is further configured to receive the toggle speeding signal, and based on the input signal, the output signal and the toggle speeding signal, the control circuit generates a digital signal.

8. The sample and hold circuit of claim 7, wherein the toggle speeding signal controls the control circuit to speed up the toggle operation of the digital signal when the first input signal is larger than the output signal.

9. The sample and hold circuit of claim 7, wherein the first input signal is equal to the input signal minus a first reference voltage difference.

10. A sample and hold method for an analog input signal comprising:
receiving an analog input signal;
providing an analog output signal;
generating a digital signal based on the analog input signal and the analog output signal, and wherein the digital signal increases when the analog output signal is lower than the analog input signal, and maintains when the analog output signal is larger than or equal to the analog input signal; and
converting the digital signal to the analog output signal;
wherein generating the digital signal comprises:
comparing the analog output signal with the analog input signal to generate a toggle control signal; and
generating the digital signal based on the toggle control signal, wherein the increase of the digital signal is determined by the toggle control signal.

11. The sample and hold method for an analog input signal of claim 10 further comprises receiving a clock signal, wherein the digital signal is generated based on the clock signal and the toggle control signal.

12. The sample and hold method for an analog input signal of claim 10, further comprising speeding up the toggle operation when the analog input signal minus a first voltage difference is larger than the analog output signal.

13. The sample and hold method for an analog input signal of claim 11, wherein generating the digital signal further comprises:
generating a abdicate control signal to control the abdicate operation of the digital signal; and
generating the digital signal further based on the abdicate control signal.

14. The sample and hold method for an analog input signal of claim 10, wherein generating the digital signal further comprises:
generating a reference signal;
comparing the analog input signal with the reference signal to generate a square signal;
generating a abdicate control signal based on the square signal to control the abdicate operation of the digital signal; and
wherein the digital signal is generated further based on the abdicate control signal.

15. The sample and hold method for an analog input signal of claim 14, wherein the value of the reference signal is half of the value of the analog output signal.

* * * * *